(12) United States Patent
Broughton

(10) Patent No.: US 6,560,297 B1
(45) Date of Patent: May 6, 2003

(54) IMAGE REJECTION DOWNCONVERTER FOR A TRANSLATION LOOP MODULATOR

(75) Inventor: Robert J. Broughton, Derry, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/325,100

(22) Filed: Jun. 3, 1999

(51) Int. Cl.[7] .......................... H04L 27/20; H04L 27/04; H04B 1/38
(52) U.S. Cl. ........................ 375/308; 375/295; 455/553
(58) Field of Search ................................ 375/308, 295, 375/306, 296, 373, 376, 375; 455/552, 553, 78, 86, 85, 260; 332/127, 126, 128

(56) References Cited

U.S. PATENT DOCUMENTS

| 5,410,743 A | | 4/1995 | Seely et al. | |
|---|---|---|---|---|
| 5,815,804 A | * | 9/1998 | Newell et al. | 330/101 |
| 5,896,562 A | * | 4/1999 | Heinonen | 455/553 |
| 6,014,551 A | * | 1/2000 | Pesola et al. | 455/267 |
| 6,043,721 A | * | 3/2000 | Nagode et al. | 330/150 |
| 6,208,875 B1 | * | 3/2001 | Damgaard et al. | 455/260 |

FOREIGN PATENT DOCUMENTS

| DE | 197 43 207 C 1 | 9/1997 |
|---|---|---|
| EP | 0 739 090 A1 | 10/1996 |
| EP | 0 917 297 A2 | 5/1999 |
| GB | 2 296 613 A | 12/1994 |

* cited by examiner

Primary Examiner—Chi Pham
Assistant Examiner—Khai Tran
(74) Attorney, Agent, or Firm—Samuels, Gauthier & Stevens, LLP

(57) ABSTRACT

A rejection converter is disclosed for use in a transmitter for operating in at least either of a first mode for transmitting signals within a first frequency range, and a second mode for transmitting signals within a second frequency range. The rejection converter includes an input unit for receiving an input signal in at least either of the first or second frequency ranges. The rejection converter also includes a rejection unit for rejecting at least one spurious harmonic signal associated with the first frequency range that falls within the second frequency range. The rejection converter permits signals in the second frequency range to be passed when the output signal is within the second frequency range.

17 Claims, 3 Drawing Sheets

IMAGE REJECTION DOWNCONVERTER FOR A TRANSLATION LOOP MODULATOR

BACKGROUND OF THE INVENTION

The invention relates to the field of transmitters for radio frequency communication systems, and particularly relates to transmitters including constant envelope modulation systems.

As wireless communication systems have become increasingly popular, a demand has developed for less expensive yet spectrally clean radio frequency (RF) transmitters having constant envelope modulation systems. High quality RF transmitters typically include relatively expensive components. For example, certain bandpass filters, such as surface acoustic wave (SAW) filters provide excellent performance yet are relatively expensive. Many applications further require transmitters that exhibit low power consumption. It is also desirable that transmitters be suitable for use with any of a plurality of standards for modulation, e.g., global system for mobile communication (GSM) or digital cellular system (DCS).

Constant envelope modulation systems including translation loop modulators are known to provide circuits having relatively less expensive filtering requirements. Translation loop modulators generally include a feedback loop in communication with the output oscillator that is coupled to a transmission antenna. The feedback loop permits the circuit itself to provide bandpass filtering since the output signal may be locked to a given center frequency.

A conventional translation loop modulation system is shown in FIG. 1. The system 10 includes quadrature modulation circuitry 12, phase comparator circuitry 14, a voltage controlled oscillator (VCO)16 coupled to an output antenna (not shown) a feedback coupler 17, and a feedback path 18. Input signals representative of the information to be modulated and transmitted may be applied to the I and Q channels of the quadrature modulator. The input signals may be modulated to adjust the phase or angle of a reference signal. This phase information is converted to a voltage signal by the phase comparator circuitry 14, and the voltage signal is then converted to a frequency signal by the VCO 16. The feedback path 18 provides a phase locked loop to lock the VCO 16 to a given center frequency.

It is conventionally known that transmitter circuits should be designed to reduce the possibility of spurious signals (e.g., harmonics as well as foreign signals) being introduced into the system. In certain situations, the origin of some spurious signals may be extremely difficult to discern, particularly if they appear only sporatically, and may be nearly impossible to simulate. To address this problem, it is conventionally believed that transmitter circuits of the type shown in FIG. 1 should be designed to be flexible so that they may be adjusted to remove any noise.

For example, in certain situations, a circuit may be most easily corrected by adjusting either the voltage controlled oscillator 20 in the phase comparator circuitry, or the voltage controlled oscillator 22 in the feedback path. Employing two separate oscillators facilitates adjustment for reducing noise since either may be adjusted independent of the other. Moreover, the frequencies may be chosen so as to not be harmonically related, which minimizes the chance of harmonic spurious signals being produced by the oscillators.

Unfortunately, however, some oscillators are rather expensive. For example, certain oscillator circuits that are formed of synthesizers produce very stable output signals, but are relatively expensive. It is also desirable that the use of relatively expensive filters be avoided.

There is a need, therefore, for inexpensive yet efficient constant envelope modulation systems for use with dual mode transmitters. There is further a need for a translation loop modulator that is spectrally efficient yet economical to produce.

SUMMARY OF THE INVENTION

The invention provides a rejection converter for use in a transmitter, such as a translation loop modulator, for operating in at least either of a first mode for transmitting signals within a fast frequency range, and a second mode for transmitting signals within a second frequency range. The converter includes an input unit for receiving an input signal in at least either of the first or second frequency ranges. The converter also includes a rejection unit for rejecting at least one spurious harmonic signal associated with the first frequency range that falls within the second frequency range. The converter permits signals in the second frequency range to be passed when the output signal is within the second frequency range.

BRIEF DESCRIPTION OF THE DRAWINGS

The following detailed description may be further understood with reference to the accompanying drawings in which.

DETAILED DESCRIPTION OF THE INVENTION

Figure 1:
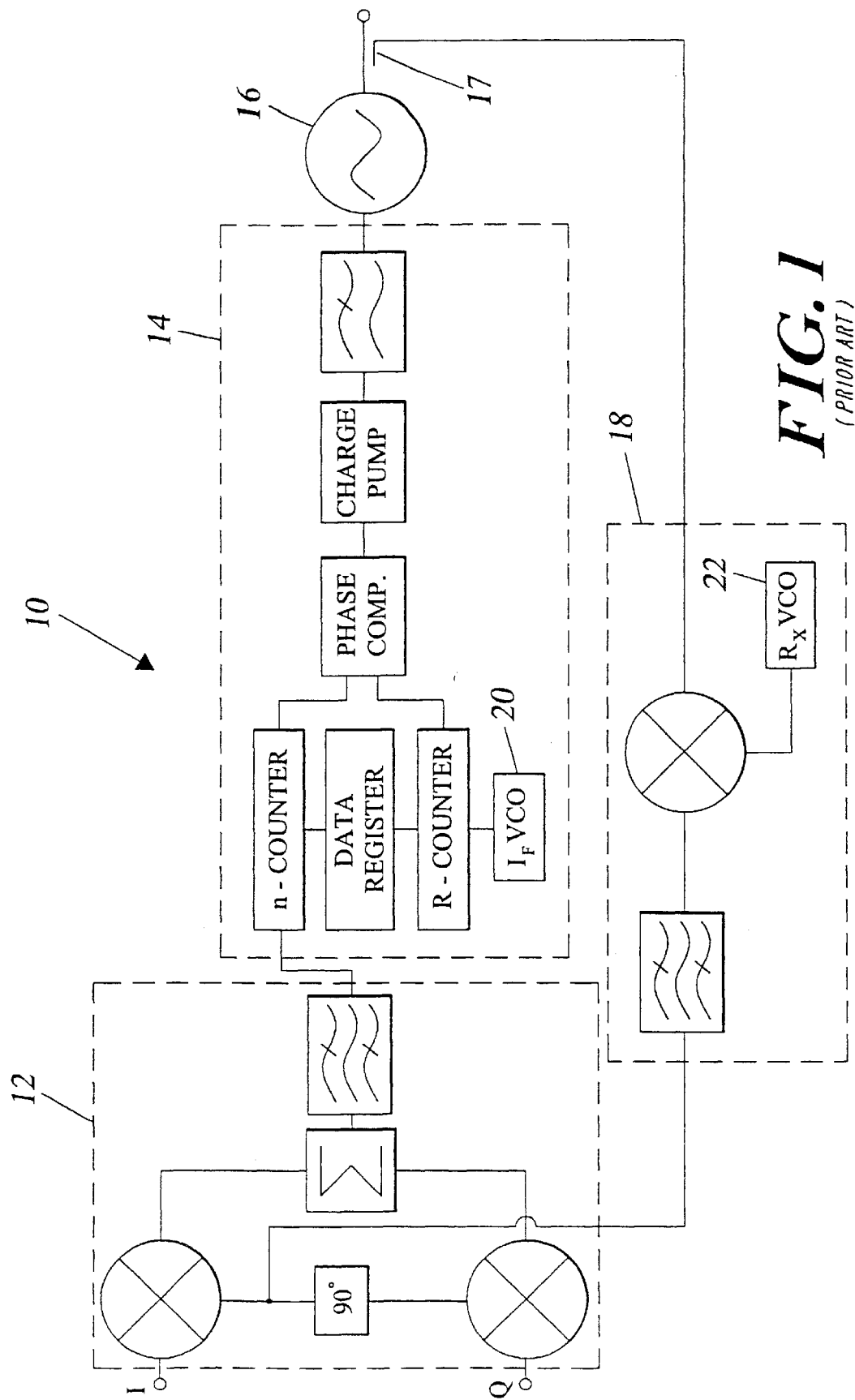
FIG. 1 shows a functional block diagram of a conventional translation loop modulator.
Figure 2:
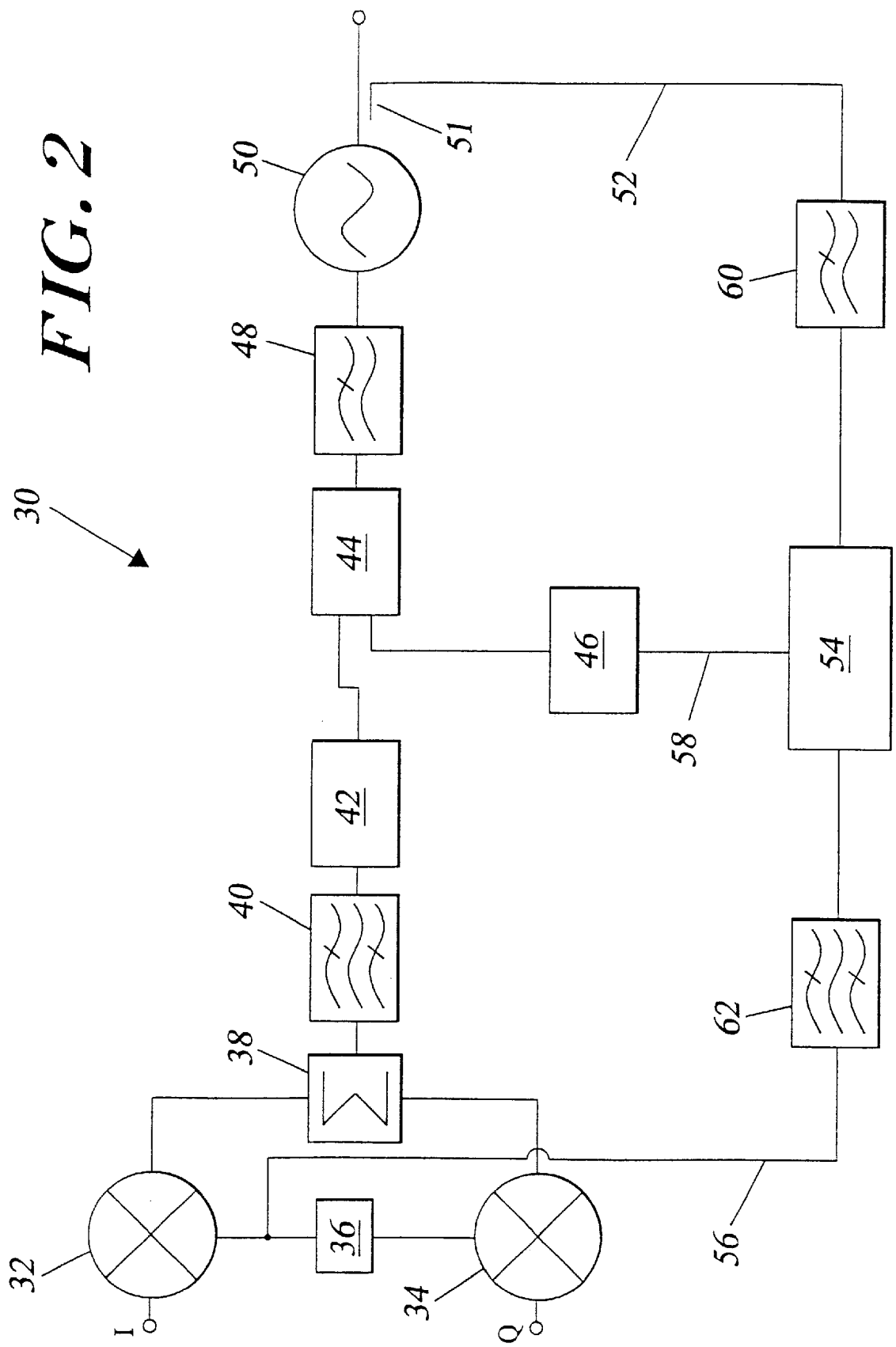
FIG. 2 shows a functional block diagram of a translation loop modulator including an image rejection downconverter of an embodiment of the invention.

It has been discovered that a translation loop modulator may include a reference oscillator that provides a local oscillator signal to both the phase comparator circuitry and to the feedback path. As shown in FIG. 2, a system 30 of an embodiment of the invention includes quadrature mixer circuitry including two mixers 32 and 34, a phase shift device 36, a summing device 38 and a bandpass filter 40. One input signal to the first mixer 32 is the I channel (or In Phase channel) input modulation signal, and the other is a feedback signal 56 without a phase shift. The output of the mixer 32 is coupled to the summing device 38. One input signal to the second mixer 34 is the Q channel (or quadrature channel) input modulation signal, and the other is a phase shifted feedback signal that is produced by the phase shift device 36. In other embodiments, various combinations of phase shifting may be employed to achieve quadrature modulation of the input signals. The output of the mixer 34 is combined with the output of the mixer 32 at the summing device 38 to produce a combined signal. This combined signal is filtered by bandpass filter 40 to produce a quadrature modulation signal.

The phase comparator circuitry of the embodiment shown in FIG. 2 includes an m frequency divider 42, a phase comparitor device 44, an n frequency divider 46, and a loop filter 48. The quadrature modulation signal is input to the m frequency divider 42. The phase comparitor device receives one input from the output of the m frequency divider 42, and the other input from the n frequency divider 46. The output of the phase comparitor device 44 is coupled to a low pass filter 48, the output of which is coupled to an output VCO 50. The VCO 50 produces the transmitter output signal 52, and is coupled to a power amplifier (not shown) as well as an antenna (not shown).

Downconverter circuitry 54 is provided together with low pass filter 60 and bandpass filter 62 in the feedback path to translate the frequency of the output signal 52 $RF_{OUT}$ to an intermediate frequency $RF_{IF}$ (the frequency of the feedback signal 56). The downconverter circuitry 54 is provided a reference signal 58 at a local oscillator frequency $RF_{LO}$, and this reference signal is provided to the n frequency divider 46 of the phase comparator circuitry. One VCO only may, therefore, provide an oscillator signal to both the phase comparator circuitry and to the downconverter mixer in the feedback circuitry. This is achieved through careful selection of components and frequency plan.

Each mixer will produce signals having frequencies at the sum as well as at the difference between the frequencies of the two input signals. In particular, the product of two sine functions $sin(\alpha) \times sin(\beta)$ equals $\frac{1}{2}cos(\alpha-\beta) - \frac{1}{2}cos(\alpha+\beta)$. The two frequencies produced at the output, therefore, would be $F_1+F_2$ and $F_1-F_2$. One of the two signal frequencies may then be filtered out. The quadrature modulation signal is then coupled to phase comparator circuitry.

The circuit provides that the frequency of the transmitter output signal ($RF_{OUT}$) may be related to the frequency of the local oscillator signal ($RF_{LO}$) in either of two ways, either $RF_{LO}/n=(RF_{LO}-RF_{OUT})/m$, or $RF_{LO}/n=(RF_{LO}+RF_{OUT})/m$. The first relationship provides that $RF_{LO}=RF_{OUT} \times n/(n-m)$ and the second relationship provides that $RF_{LO}=RF_{OUT} \times n/(n+m)$. The values of m and n may be chosen such that the transmitter output signal may be at 900 MHz for GSM, and may be at 1800 MHz for DCS. This may be achieved by recognizing that $R_{OUT}=RF_{LO}+RF_{IF}$ for DCS and $RF_{OUT}=RF_{LO}-RF_{IF}$ for GSM where $RF_{IF}$ is the frequency of the intermediate frequency signal, which is the feedback signal to the quadrature modulator.

During operation, the output of the phase comparator 44 provides a do voltage responsive to the phase difference between two input signals of the same frequency. For example, the input signals to the phase comparator 44 may each be 225 MHz in frequency. If m=2 and n=6, then the signal input to the m frequency divider 42 must be 450 MHz in frequency, and the signal input to the n frequency divider 46 must be 1350 MHz. For GSM, the output signal produced by the transmit oscillator will be 900 MHz in frequency. This signal is output to the transmitter antenna (not shown). For these values of m and n, therefore, $RF_{LO}=\frac{3}{2} RF_{OUT}$ for GSM, $RF_{LO}=\frac{3}{4} RF_{OUT}$ for DCS.

By controlling I and Q, the phase (or angle) of the 450 MHz signal that is input to the m divider 42 may be precisely controlled. For example, if zero volts is applied on the Q input and one volt is applied to the I input, then the signal provided to the divider circuitry would be a 450 MHz signal at zero degrees. If zero volts is applied on the Q input and negative one volt on the I input, then the quadrature output signal would be a 450 MHz signal at 180 degrees. If one volt is applied on the Q input and zero volts on I input, then the output signal would be a 450 MHz signal at 90 degrees. If negative one volt is applied on the Q input and zero volts is applied to the I input, then the output signal would be a 450 MHz signal at -90 degrees. By adjusting the I and Q inputs, the angle of the 450 MHz signal may be fully adjusted.

The quadrature modulator therefore provides the modulation for the RF output signal. The output of the phase comparator produces a signal at the frequency of the sum of the inputs, as well as a signal at a frequency of the difference between the inputs. The signal at the sum frequency (450 MHz) is filtered out at the filter 48, and the do signal (zero MHz.) is input to the voltage controlled oscillator, which in turn, produces the output signal for the antenna. The filter 48 also filters any other noise that may develop in the system. The output of divider 46 is not modulated, whereas the output of divider 42 is modulated. The output of device 44 and filter 48 is a DC voltage including modulation information.

With proper selection of the downconverter oscillator, the filters 40 and 48, and the values of the frequency dividers 42 and 46, a translation loop modulator circuit may be provided using one oscillator that is coupled to the phase comparator circuitry and the feedback circuitry. In other embodiments, the values of m and n may be different, e.g, m=2 and n=6. In this case as well, however, $RF_{LO}=\frac{3}{2} RF_{OUT}$ for GSM, and $RF_{LO}=\frac{3}{4} RF_{OUT}$ for DCS.

Higher order intermodulation products may be tow pass filtered, but the image frequency must be filtered or rejected. Since $RF_{IF}=(m/n) RF_{LO}$, the frequency of the output signal $RF_{OUT}$ may be described as $RF_{OUT}=RF_{LO}(1+m/n)$ for DCS and $RF_{OUT}=RF_{LO}(1-m/n)$ for GSM. The translation, therefore, of the frequency of the output signal $RF_{OUT}$ to the intermediate frequency $RF_{IF}$ may be described as $RF_{IF}=|K \times RF_{OUT}-J \times RF_{LO}|$, where K and J are integers. In a distortionless system, K=J=1. In a system exhibiting some distortion, J and K represent the harmonic orders of both $RF_{LO}$ and $RF_{OUT}$ respectively, which may also create products at $RF_{IF}$. These harmonics may be generated by the transmit VCO 50, the reference oscillator, or by non-linearities in the downconverter circuitry. Since J represents the harmonic value of $RF_{LO}$, and K represents the harmonic value of $RF_{OUT}$, the values of J and K may be determined from the relationship $J=K+(K \pm 1)(m/n)$ for DCS and $J=K-(K \pm 1)(m/n)$ for GSM, again, where J, K, m and n are integers.

For example, in a GSM system where m=2 and n=6, K=2 (the second harmonic of the transmit VCO) and J=1 (the fundamental of the reference oscillator). For a dual mode radio, the second harmonic of the GSM transmit output signal falls into the DCS transmit band, and cannot be simply filtered. For this choice of m and n, $RF_{OUT}=2RF_{IF}$ since $RF_{OUT}=RF_{LO}-RF_{IF}=\frac{6}{2}RF_{IF}-RF_{IF}$. The second harmonic of the GSM frequency is the image frequency of the desired response. An image rejection mixer may be used to accommodate both GSM and DCS modes.

The circuit may include two separate VCOs with transmit filters to provide the necessary filtering, but such a circuit adds costs and complexity to the circuit, and further may add distortion. A switched filter may also provide the required filtering, but such filters also add cost and complexity to the circuit, and also may add distortion.

Figure 3:
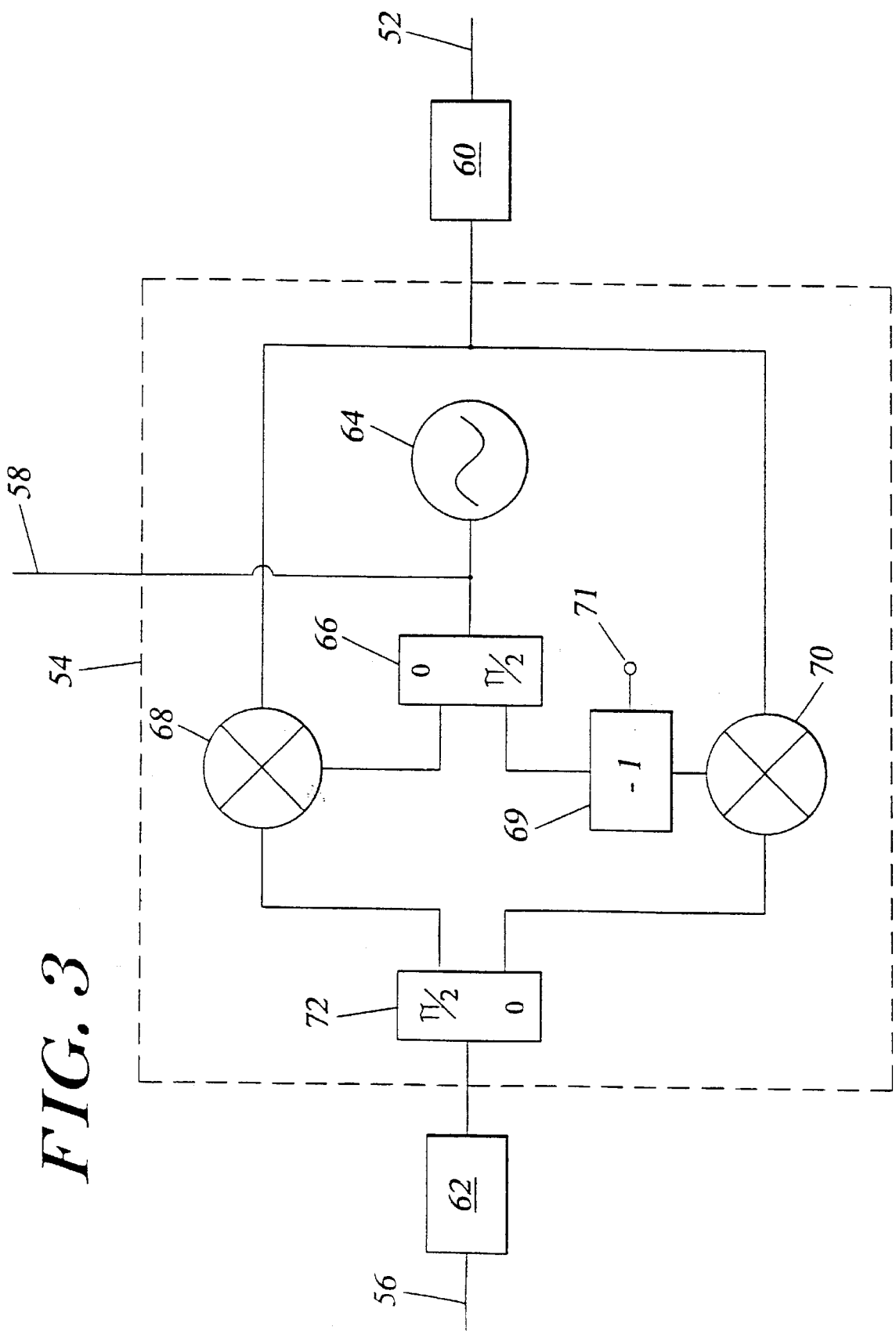
FIG. 3 shows a functional block diagram of the image rejection downconverter shown in FIG. 2.

As shown in FIG. 3, the downconverter circuitry 54 of the embodiment shown in FIG. 2 includes a VCO 64 that is coupled to the n frequency divider 46 (shown in FIG. 2) and a quadrature divider 66. The VCO 64 produces the local oscillator signal 58. The quadrature divider 66 is coupled to two mixers 68 and 70, each of which is also coupled to the low pass, filter 60 in communication with the output transmit signal. The quadrature divider 66 produces two signals, one having a phase shift of 90 degrees and the other with zero degrees phase shift. The zero degree phase shift signal from the quadrature divider 66 is input to the first mixer 68, and the 90 degree phase shift signal from the quadrature divider 66 is coupled to the second mixer 70 via a selective inverter 69. The output of the low pass filter 60 is also input to each of the mixers 68 and 70. The selective inverter 69 selectively inverts an input signal responsive to a selection signal at 71. In GSM mode the selective inverter is disabled and therefore does not invert the input signal thereof, and in DCS mode the selective inverter is enabled by applying an enable signal at 71.

The output of the first mixer 68 is coupled to a 90 degrees phase shift input of a quadrature combiner 72, and the output of the second mixer 70 is coupled to a zero degrees phase shift input of the quadrature combiner 72. The output of the quadrature combiner is coupled to the bandpass filter 62, which in turn, is coupled to the quadrature modulation circuitry shown in FIG. 2.

The operation of the circuit may be further described with reference to FIG. 3, as well as a discussion of the relationships between the signals. In short, the described circuit provides that signals at the GSM frequency are passed, as are signals at the DCS frequency, but signals at twice the GSM frequency are rejected.

For GSM operation, $RF_{OUT}=RF_{LO}-RF_{IF}$, which may be written as $\omega_G=\omega_L-\omega_I$. This represents the difference product. The feedback signal ($a_1$) from the low pass filter 60 may be represented as $\sin(\omega_L-\omega_I)t=\sin \omega_G t$. The signal ($a_2$) produced by the VCO 64 and passed through the quadrature divider 66 (at zero phase) to the mixer 68 may be represented as:

$a_2=\sin \omega_L t$, and the phase shifted signal that is coupled to the other mixer is:

$$a_2'=\sin(\omega_L t+\pi/2)=\cos \omega_L t.$$

The signal ($a_3$) produced by the mixer 68 is given by:

$$a_3=\sin(\omega_L-\omega_I)t\times\sin \omega_L t=\tfrac{1}{2}\cos(\omega_L-\omega_I-\omega_L)t-\tfrac{1}{2}\cos(\omega_L-\omega_I+\omega_L)\ t;$$

or $$a_3=\tfrac{1}{2}\cos(-\omega_I)t-\tfrac{1}{2}\cos(2\omega_L-\omega_I)t$$

The second term is ultimately filtered by filter 62, so it can be ignored here. Since $\cos(-\alpha)=\cos \alpha$, $a_3$ may be expressed as:

$$a_3=\tfrac{1}{2}\cos \omega_I t$$

The signal ($a_4$) that is produced by the mixer 70 is provided by:

$$a_4=a_1 a_2'=\sin(\omega_L-\omega_I)t\times\sin(\omega_L t+\pi/2)=$$
$$\sin(\omega_L-\omega_I)t\times\cos \omega_L t=$$
$$\tfrac{1}{2}\sin(2\omega_L-\omega_I)t\times\tfrac{1}{2}\sin(-\omega_I)t=$$
$$\tfrac{1}{2}\sin(2\omega_L-\omega_I)t\times\tfrac{1}{2}\sin(-\omega_I)t$$

The first term is rejected by filter 62, so it can be ignored. Since $\sin(-\alpha)=-\sin \alpha$, then $a_4$ may be expressed as $a_4=-\tfrac{1}{2}\sin \omega_I t$.

The output signal $a_O$ may be expressed as $a_3'+a_4$, where $$a_3'=\tfrac{1}{2}\cos(\omega_I't+\pi/2)=-\tfrac{1}{2}\sin \omega_I t.$$

So, $a_O=-\tfrac{1}{2}\sin \omega_I t+(-\tfrac{1}{2}\sin \omega_I t)=-\sin \omega_I t$.

The undesired GSM harmonic is filtered as follows. The sum product $\omega_L+\omega_I=2\omega_G$.
In this case, $$a_I=\sin(\omega_L+\omega_I)t=\sin 2\omega_G t$$
$$a_2=\sin \omega_L t,$$

and $$a_3=a_1 a_2=\sin(\omega_L+\omega_I)t\times\sin \omega_L t=$$
$$\tfrac{1}{2}\cos(\omega_L-\omega_I-\omega_L)t-\tfrac{1}{2}\cos(\omega_L+\omega_I+\omega_L)t=$$
$$\tfrac{1}{2}\cos \omega_I t-\tfrac{1}{2}\cos(2\omega_L+\omega_I)t$$

Again, the second term is filtered by the filter 62, so $a_3=\tfrac{1}{2}\cos \omega_I t$. The phase shifted term ($a_3'$) is expressed as, $$a_3'=\tfrac{1}{2}\cos(\omega_I t+\pi/2)=-\tfrac{1}{2}\sin \omega_I t$$

Since $a_4=a_1 a_2'$, $$a_4=\sin(\omega_L+\omega_I)t\times\sin(\omega_L t+\pi/2)=$$
$$\sin(\omega_L+\omega_I)t\times\cos \omega_L t=$$
$$\tfrac{1}{2}\sin(\omega_L+\omega_I+\omega_L)t+\tfrac{1}{2}\sin(\omega_L+\omega_I-\omega_L)t=$$
$$\tfrac{1}{2}\sin(2\omega_L+\omega_I)t+\tfrac{1}{2}\sin \omega_I t$$

Again, the first term is rejected by filter 62, so it can be ignored. The signal ($a_4$) may therefore be expressed as $a_4=\tfrac{1}{2}\sin \omega_I t$.

In this case, the output signal $a_O$ may be expressed as $a_3'+a_4$, where $$a_3'=\tfrac{1}{2}\cos(\omega_I t+\pi/2)=-\tfrac{1}{2}\sin \omega_I t.$$

So, $a_O=-\tfrac{1}{2}\sin \omega_I t+\tfrac{1}{2}\sin \omega_I t=0$.

For DCS, the signal ($a_2$) must be inverted prior to being input to the mixer 70. The signal $a_2$ is inverted by the selective inverter 69 that inverts an input signal responsive to a selector signal at 7$i$. In GSM mode, the selector signal does not direct the selective inverter 69 to invert the input signal. In DCS mode, the selector signal is enabled causing the selective inverter 69 to invert its input signal ($a_4$) and produce an inverted signal ($-a_2$) which is input to the mixer 70 as shown in FIG. 3.

Solving for the signal ($a_1$) entering mixers 68 and 70 from the filter 60, $a_1=\sin(\omega_L+\omega_I)t=\sin \omega_D t$. The signal produced by the VCO 64 ($a_2$) is given by $$a_2=\sin \omega_L,$$

and $$a_2'=\sin(\omega_L t+\pi/2)=\cos \omega_L t.$$

The signal produced by the mixer 68 ($a_3$) is given by $a_3=a_1 a_2$, or $$a_3=\sin(\omega_L+\omega_I)t\times\sin \omega_L t=$$
$$\tfrac{1}{2}\cos(\omega_L+\omega_I-\omega_L)t-\tfrac{1}{2}\cos(\omega_L+\omega_I+\omega_L)t=$$
$$\tfrac{1}{2}\cos \omega_I t-\tfrac{1}{2}\cos(2\omega_L+\omega_I)t$$

Again, the second term is filtered, so $a_3=\tfrac{1}{2}\cos \omega_I t$. The signal $a_3'$ produced internally by the quadrature divider 66 responsive to $a_3$ is provided by:

$$a_3'=\tfrac{1}{2}\cos(\omega_I t+\pi/2)=-\tfrac{1}{2}\sin \omega_I t.$$

The signal $a_4$ produced by the mixer 70 is given by $a_4=a_1\times(-a_2')$, or $$a_4=\sin(\omega_L+\omega_I)t\times-\sin(\omega_L t+\pi/2)=$$
$$-\sin(\omega_L+\omega_I)t\times\cos \omega_L t=$$
$$-\tfrac{1}{2}\sin(\omega_L+\omega_I+\omega_L)t-\tfrac{1}{2}\sin(\omega_L+\omega_I-\omega_L)t=$$
$$\tfrac{1}{2}\sin(2\omega_L+\omega_I)t-\tfrac{1}{2}\sin \omega_I t.$$

Since the first term is filtered, $a_4=-\tfrac{1}{2}\sin \omega_I t$

Solving, therefore, for the feedback signal ($a_O$) for DCS provides that:

$$a_O=a_3'+a_4,$$

or $$a_O=-\tfrac{1}{2}\cos \omega_I t+\tfrac{1}{2}\cos \omega_I t,$$

or $$a_O=-\sin \omega_I t.$$

The product, therefore, resulting from twice the signal for GSM is rejected while the fundamental GSM signal (x1) is passed. By inverting the signal $a_2'$, DCS mode is accommodated with a minimum amount of additional circuitry.

Those skilled in the art will appreciate that numerous modifications and variations may be made to the above disclosed embodiments without departing from the spirit and scope of the invention.

What is claimed is:

1. A rejection converter for use in a transmitter for operating in at least either of a first mode for transmitting signals within a first frequency range, and a second mode for transmitting signals within a second frequency range, said rejection converter comprising:

input means for receiving an input signal in at least either of said first or second frequency ranges; and rejection means for rejecting at least one spurious harmonic signal associated with said first frequency range that falls within said second frequency range by translating said input signal to an intermediate signal within a third frequency range that is lower than each of said first and second frequency ranges such that the frequency of the input signal is an integer multiple of the frequency of the intermediate signal, and for permitting signals in said second frequency range to be passed when the transmitter is operating in the second mode.

2. A rejection converter as claimed in claim 1, wherein the transmitter is a translation loop modulator and said rejection converter forms a portion of a feedback path of the translation loop modulator.

3. A rejection converter as claimed in claim 1, wherein said input means for said rejection converter is coupled to an output transmission signal of the transmitter.

4. A rejection converter as claimed in claim 1, wherein said transmitter is a translation loop modulator comprising phase comparator circuitry, and said rejection converter is coupled to said phase comparator circuitry to provide a reference signal to the phase comparator circuitry.

5. A rejection converter as claimed in claim 1, wherein said transmitter is a translation loop modulator comprising a feedback path and a quadrature modulator, and said rejection converter is coupled to the quadrature modulator.

6. A rejection converter as claimed in claim 1, wherein said rejection converter further includes oscillator means for generating a reference signal.

7. A rejection converter as claimed in claim 1, wherein said rejection converter further includes quadrature components for quadrature dividing a reference signal.

8. A rejection converter as claimed in claim 1, wherein said rejection converter further includes quadrature components for quadrature combining at least two component signals.

9. A rejection converter as claimed in claim 1, wherein said input means includes a pair of mixers, each of said pair of mixers for combining the input signal with a quadrature phase shifted reference signal.

10. A downconverter for use in a translation loop modulator for outputting transmission signals in at least either of a first or second frequency range, said downconverter comprising:

input means for receiving output transmission signals in at least either of said first or second frequency range;

oscillator means far generating a reference signal; and quadrature rejection means for rejecting a spurious harmonic signal having a frequency that is an integer multiple of an input signal that is within said first frequency range by translating said input signal to an intermediate signal within a third frequency range that is lower than each of said first and second frequency ranges such that the frequency of the input signal is an integer multiple of the frequency of the intermediate signal, wherein said spurious harmonic signal is within said second frequency range, and wherein said quadrature rejection means permits output transmission signals within said second frequency range to be passed through said downconverter.

11. A downconverter as claimed in claim 10, wherein said quadrature rejection means includes quadrature components for quadrature dividing the reference signal.

12. A downconverter as claimed in claim 10, wherein said quadrature rejection means includes quadrature components for quadrature combining at least two component signals.

13. A downconverter as claimed in claim 10, wherein said input means includes a pair of mixers, each of said pair of mixers for combining the input signal with a quadrature phase shifted reference signal.

14. A translation loop modulator for outputting transmission signals in either of a first or second frequency range, said translation loop modulator comprising:

input modulation means for receiving at least one input signal that is representative of information to be modulated, for receiving a feedback signal, and for producing an intermediate modulated signal responsive to said input signal and said feedback signal;

comparator means for receiving said intermediate modulated signal and a reference signal, and for producing an output transmission signal responsive to said intermediate modulated signal and said reference signal;

image rejection feedback circuitry coupled to said output transmission signal, and to said input modulation means, said feedback circuitry including rejection means for rejecting a spurious harmonic signal having a frequency that is an integer multiple of an output transmission signal that is within said first frequency range by translating said input signal to an intermediate signal within a third frequency range that is lower than each of said first and second frequency ranges such that the frequency of the input signal is an integer multiple of the frequency of the intermediate signal, wherein said spurious harmonic signal is within said second frequency range, and wherein said image rejection feedback circuitry permits output transmission signals within said second frequency range to be passed through said image resection feedback circuitry.

15. A translation loop modulator as claimed in claim 14, wherein said image resection feedback circuitry includes oscillator means for generating a reference signal.

16. A translation loop modulator as claimed in claim 14, wherein said image rejection feedback circuitry includes quadrature divider means for quadrature dividing a reference signal.

17. A translation loop modulator as claimed in claim 14, wherein said image rejection feedback circuitry includes quadrature combiner means for combining at least two quadrature related signals that have been mixed with the output transmission signal.

* * * * *